(12) United States Patent
Katoh et al.

(10) Patent No.: US 9,065,031 B2
(45) Date of Patent: Jun. 23, 2015

(54) LIGHT-EMITTING DEVICE WITH LIQUID-REPELLENT LAYER AND MANUFACTURING METHOD THEREFORE

(75) Inventors: Masaaki Katoh, Osaka (JP); Toshio Hata, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 144 days.

(21) Appl. No.: 13/811,815

(22) PCT Filed: Jun. 27, 2011

(86) PCT No.: PCT/JP2011/064624
§ 371 (c)(1),
(2), (4) Date: Jan. 23, 2013

(87) PCT Pub. No.: WO2012/011363
PCT Pub. Date: Jan. 26, 2012

(65) Prior Publication Data
US 2013/0119426 A1 May 16, 2013

(30) Foreign Application Priority Data

Jul. 23, 2010 (JP) ................................. 2010-166415

(51) Int. Cl.
| | | |
|---|---|---|
| *H01L 33/00* | (2010.01) | |
| *H01L 21/00* | (2006.01) | |
| *H01L 33/62* | (2010.01) | |
| *H01L 33/48* | (2010.01) | |
| *H01L 33/50* | (2010.01) | |

(52) U.S. Cl.
CPC .............. *H01L 33/62* (2013.01); *H01L 33/486* (2013.01); *H01L 2933/0033* (2013.01); *H01L 2933/005* (2013.01); *H01L 2224/16225* (2013.01); *H01L 2224/48227* (2013.01); *H01L 2224/73265* (2013.01); *H01L 33/50* (2013.01); *H01L 2224/32225* (2013.01); *H01L 2933/0041* (2013.01)

(58) Field of Classification Search
CPC ..................... H01L 2924/12041; H01L 33/62; H01L 33/486; H01L 33/483; H01L 33/54; H01L 33/38; H01L 33/56; H01L 33/50; H01L 33/48; H01L 51/5262; H01L 33/52
USPC .............. 257/98, 99, 100, E33.057, E33.058, 257/E33.059; 438/22, 25, 26, 29
See application file for complete search history.

(56) References Cited

U.S. PATENT DOCUMENTS 7,824,937 B2 * 11/2010 Suehiro et al. .................. 438/26

FOREIGN PATENT DOCUMENTS

| JP | 11-298048 | 10/1999 |
|---|---|---|
| JP | 2005-136224 | 5/2005 |

(Continued)

*Primary Examiner* — Minh-Loan Tran
(74) *Attorney, Agent, or Firm* — Morrison & Foerster LLP

(57) ABSTRACT

A low-cost and productivity-oriented surface mount light-emitting device is provided. The light-emitting device includes an insulating film 2, at least one pair of land portions 3a and 3b comprising metal film pieces formed on the top surface of the insulating film 2, external connection terminal portions 4a and 4b comprising metal film pieces formed on the bottom surface of the insulating film 2, that are opposed to the land portions 3a and 3b across the insulating film 2 in one-to-one correspondence, through-conductors 7a and 7b that connect between the land portions 3a and 3b and the terminal portions 4a and 4b corresponding to each other through the insulating film 2, and a light-emitting element 10 that is electrically connected to the pair of the land portions 3a and 3b and disposed in a unit section which contains the pair of the land portions 3a and 3b.

20 Claims, 15 Drawing Sheets

(56) References Cited

FOREIGN PATENT DOCUMENTS

| JP | 2009-70869 | 4/2009 |
| JP | 2009-164242 | 7/2009 |
| JP | 2009-239036 | 10/2009 |
| JP | 2010-129870 | 6/2010 |
| JP | 2010-239004 | 10/2010 |
| TW | 2010-07831 | 2/2010 |

* cited by examiner a surface mount light-emitting device and a manufacturing method therefor, and particularly relates to a low-cost and productivity-oriented surface mount light-emitting device and a manufacturing method therefor.

LIGHT-EMITTING DEVICE WITH LIQUID-REPELLENT LAYER AND MANUFACTURING METHOD THEREFORE

REFERENCE TO RELATED APPLICATIONS

This application is a national stage application under 35 USC 371 of International Application No. PCT/JP2011/064624, filed Jun. 27, 2011, which claims the priority of Japanese Patent Application No. 2010-166415, filed Jul. 23, 2010, the entire contents of which are incorporated herein by reference.

FIELD OF THE INVENTION

The present invention relates to a surface mount light-emitting device and a manufacturing method therefor, and particularly relates to a low-cost and productivity-oriented surface mount light-emitting device and a manufacturing method therefor.

BACKGROUND OF THE INVENTION

As a surface mount light-emitting device in which a dice of a light-emitting diode (LED) (semiconductor bare chip) is mounted on a substrate surface and sealed with a transparent resin, for example, there are those disclosed in Patent Document 1 and Patent Document 2 described below, and the like.

An example of a cross-sectional constitution of the LED lighting module disclosed in Patent Document 1 is shown in FIG. 13. This LED lighting module has a flexible wiring substrate obtained by forming a circuit wiring 101 on a flexible substrate 100, forming a flexible substrate 103 on it through an adhesive 102, and forming a flexible reflective layer 105 that reflects light from a dice 104 of LED on it, and also has a heat spreader 106 that penetrates through the flexible wiring substrate, and the dice 104 of LED mounted on the heat spreader 106, wherein an electrode on the top side of the dice 104 of LED is connected to an exposed surface of the circuit wiring 101 through an opening provided on the flexible substrate 103 by wire bonding.

An example of a light-emitting device in which a dice of LED is mounted on an LED mounting substrate disclosed in Patent Document 2 is shown in FIG. 14. This light-emitting device has a structure obtained by providing a resin substrate 201 on a metal plate 200, providing a plurality of concave portions 202 of which bottom is a top surface of the exposed metal plate 200 with the resin substrate 201 in an array form, mounting a dice 203 of LED on the metal plate 200 in each concave portion 202, connecting an electrode in the back side of LED to the metal plate 200, connecting an electrode in the top side of LED to a connection member provided in the surface of the resin substrate 201 by wire bonding, and sealing the dice 203 of LED in the concave portion 202 with a light-transmitting resin 204.

Patent Document 1: Japanese Patent Application Laid-Open Publication No. 2005-136224
Patent Document 2: Japanese Patent Application Laid-Open Publication No. 11-298048

SUMMARY OF THE INVENTION

Recently, LED characterized by achieving higher luminance and having low power consumption, high impact resistance and long life, is utilized in various fields, such as a display device, a lighting device, and a backlight device of a liquid crystal television or a liquid crystal monitor. While application and expectation of LED are raised, a demand for inexpensive LED light-emitting device is also increased, thus it is necessary to reduce the cost of dice of LED and also reduce the mounting cost thereof.

In a light-emitting device with a structure shown in FIG. 13, a structure for taking out a circuit wiring 101 depending on the application embodiment of the light-emitting device is separately necessary, and also a flexible wiring substrate has a structure in which a circuit wiring is sandwiched between a two-layer flexible substrate. Therefore, in order to cut out and use the required number of the light-emitting devices from the flexible wiring substrate, it is necessary to cut the flexible wiring substrate by a special processing device, thus this structure is not considered as appropriate for mass production at a low cost.

In addition, in a light-emitting device with a structure shown in FIG. 14, on the premise that a plurality of LEDs are parallel-connected and mounted, it is necessary to previously determine the size of a substrate and the number of concave portions, depending on the number of parallel LEDs. In order to cut out and use the required number of the light-emitting devices, it is necessary to cut a substrate including two layers of a metal plate and a resin substrate by a special processing device, thus this structure is not considered as appropriate for mass production at a low cost. Also, since the wirings of the electrodes of LED are separately taken out from the back side and top side of the substrate, it is not appropriate to surface mount on a printed substrate or the like, and this inhibits cost reduction.

The present invention was made in view of the above problems, and it is an object of the present invention to provide a low-cost and productivity-oriented surface mount light-emitting device and a manufacturing method therefor.

In order to achieve the above object, the present invention provides a light-emitting device characterized by including:
an insulating film,
at least one pair of land portions comprising metal film pieces formed on the top surface of the insulating film,
external connection terminal portions comprising metal film pieces formed on the bottom surface of the insulating film, the terminal portions being opposed to the land portions across the insulating film in one-to-one correspondence,
through-conductors that connect between the land portions and the terminal portions corresponding to each other through the insulating film, and
a light-emitting element that is electrically connected to the pair of the land portions and disposed in a unit section which contains the pair of the land portions.

Furthermore, the present invention provides a method for manufacturing a light-emitting device characterized by including the steps of:
forming at least one pair of land portions comprising metal film pieces, on the top surface of the insulating film,
forming external connection terminal portions comprising metal film pieces, that are opposed to the land portions across the insulating film in one-to-one correspondence, on the bottom surface of the insulating film,
forming through-conductors that connect between the land portions and the terminal portions corresponding to each other through the insulating film, and
electrically connecting a light-emitting element to the pair of the land portions and disposing the light-emitting element in a unit section which contains the pair of the land portions and a gap therebetween.

According to the light-emitting device and manufacturing method for a light-emitting device having the above characteristics, a number of unit sections can be formed on one insulating film, and a surface mount light-emitting device having the desired number of unit sections can be inexpensively manufactured only by cutting the insulating film between the unit sections. Herein, the insulating film is naturally formed by an electrically insulating material such that individual land portions and individual terminal portions are electrically separated.

In addition, a light-emitting element is provided on the top side of the insulating film, and a pair of external connection terminal portions electrically connected to electrodes of the light-emitting element is formed on the bottom side of the insulating film, per a unit section. Therefore, when the light-emitting element is mounted on other devices such as a printed substrate, it is not specifically necessary to take out a terminal or the like, and the mounting cost associated with the use of the present light-emitting device can be also reduced. Moreover, when the light-emitting device has a plurality of unit sections, a pair of external connection terminal portions is provided per a unit section. Thus, various uses are possible depending on the intended use, such as when light-emitting elements of each unit section are connected in series, connected in parallel, individually driven, and the like.

Furthermore, it is preferred that the light-emitting device having the above characteristics include an annular liquid-repellent layer on each pair of the land portions, the annular liquid-repellent layer having an opening in the center, the opening exposing at least part of a gap between the pair of the land portions, wherein the light-emitting element be disposed inside the opening, and a phosphor containing resin or transparent resin that seals the light-emitting element be formed in a dome shape in the opening.

Furthermore, it is preferred that the method for manufacturing a light-emitting device having the above characteristics include the steps of:

forming an annular liquid-repellent layer on each pair of the land portions, the annular liquid-repellent layer having an opening in the center, the opening exposing at least part of a gap between the pair of the land portions, and forming a phosphor containing resin or transparent resin that seals the light-emitting element in a dome shape in the opening, and the light-emitting element be disposed in the inside of the opening.

Furthermore, in the method for manufacturing a light-emitting device having the above characteristics, it is preferred that the step of forming the phosphor containing resin or transparent resin include covering the top side of the insulating film with a mask member having an opening per the unit section, the opening exposing at least part of the opening of the liquid-repellent layer, and injecting the phosphor containing resin or transparent resin into the opening of the mask member.

Furthermore, in the light-emitting device having the above characteristics and the method for manufacturing the same, it is preferred that the liquid-repellent layer contain phosphor.

Furthermore, in the method for manufacturing a light-emitting device having the above characteristics, it is preferred that the opening of the mask member be formed such that the top surface of the liquid-repellent layer is not exposed when the liquid-repellent layer is covered with the mask member.

Furthermore, in the method for manufacturing a light-emitting device having the above characteristics, it is preferred that the injection of the phosphor containing resin or transparent resin be carried out by a squeegee printing method or potting method, using the mask member or a mask member provided with a liquid-repellent film on the inner wall of the opening of the mask member.

The liquid-repellent layer is provided around the light-emitting element, whereby a resin that seals the light-emitting element is easily formed in a dome shape (convex upward) due to liquid repellency of the liquid-repellent layer against the sealing resin, surface tension of the sealing resin itself, and interfacial tension between the sealing resin and a metal surface of the land portion. In addition, using a mask having openings on the positions in which the sealing resin is formed, the sealing resin is injected into the opening by a squeegee printing method, potting method, or the like, whereby the sealing resin can be formed in a dome shape at a low cost.

Here, when the top surface of the liquid-repellent layer is not exposed by the opening of the mask member, specifically, when the opening diameter of the mask member is smaller than the opening diameter of the liquid-repellent layer (when both openings are circular), diffusion of the sealing resin in a lateral direction is appropriately inhibited by the difference in levels of the liquid-repellent layer and the surface of the land portions and the liquid repellency of the liquid-repellent layer against the sealing resin, thus the dome shape of the sealing resin can be properly maintained.

In addition, since the liquid-repellent layer and the sealing resin are filled in the gap between the pair of the land portions, short circuit between the pair of the land portions can be prevented. Accordingly, the liquid-repellent layer and the sealing resin naturally have electrical insulation properties.

Moreover, by the water repellency of the liquid-repellent layer, water infiltration into the light-emitting element can be prevented. Furthermore, when the liquid-repellent layer contains phosphor, the accuracy and efficiency of the alignment of mask member are improved by light emission from the phosphor contained in the liquid-repellent layer.

Here, when the sealing resin contains phosphor, the light emission from the light-emitting element and the light emission from the phosphor excited by the light emission are mixed, and the light emission color and color rendering properties of the light-emitting device can be adjusted. Also, in a case where the sealing resin is a transparent resin which does not contain phosphor, the light emission from the light-emitting element can be directly output. Therefore, the light emission wavelengths from a plurality of the light-emitting elements are combined, whereby the light emission color and color rendering properties of the light-emitting device can be adjusted.

Furthermore, in the light-emitting device having the above characteristics, it is preferred that the insulating film and the land portions, and the insulating film and the terminal portions, be connected through an adhesive layer, respectively.

Furthermore, in the light-emitting device having the above characteristics, it is preferred that a cutting region for singulating the unit section as a minimum unit be provided around the unit section on the insulating film in a lattice pattern, a pair of the terminal portions be formed on the bottom surface of the insulating film, per the unit section surrounded by the cutting region, and the metal film pieces be not formed on the top surface and the bottom surface of the insulating film in the cutting region.

Furthermore, in the light-emitting device having the above characteristics, it is preferred that the insulating film be cut along the cutting region, whereby one or a plurality of the unit sections be singulated.

Furthermore, it is preferred that the method for manufacturing a light-emitting device having the above characteristics include a step of cutting the insulating film along the cutting region to singulate one or a plurality of the unit sections, the cutting region being provided around the unit section for singulating the unit section as a minimum unit.

Furthermore, in the method for manufacturing a light-emitting device having the above characteristics, it is preferred that the insulating film be cut along the cutting region using a commercially available simple cutting tool such as a box cutter, a roller cutter, or a rotary cutter.

According to the light-emitting device and manufacturing method for a light-emitting device having the above characteristics, a number of light-emitting devices or a light-emitting device having the desired number of unit sections can be inexpensively manufactured by a simple operation of merely cutting the insulating film along the cutting region. Also, since dust, small chips and the like generated by cutting are reduced, adhesion of the dust and small chips to the sealing resin surface is also reduced, and the effect on luminance and chromaticity can be reduced.

Furthermore, in the light-emitting device having the above characteristics, it is preferred that a reinforcement material be filled in a gap between a pair of terminal portions corresponding to the pair of the land portions, per the unit section. Here, due to the necessity that the pair of the terminal portions is electrically insulated and separated from each other, it is necessary that the reinforcement material is an insulating material. Thus, a part exposed to the bottom side of the insulating film is protected by the reinforcement material, and also the pair of the terminal portions is mechanically connected by the reinforcement material and is unlikely to deform.

In addition, due to the presence of the reinforcement material, conductive minute dust and the like can be prevented from entering into the above gap, and short circuit between the pair of the terminal portions can be prevented. Also, when the reinforcement material is slightly projected downward from the bottom surface of the terminal portion, the projection becomes a jetty for preventing solder from flowing when a light-emitting device is soldered onto other substrate, thus short circuit between the pair of the terminal portions can be more effectively prevented.

As described above, according to the present invention, a low-cost and productivity-oriented surface mount light-emitting device and a manufacturing method therefor can be provided.

DETAILED DESCRIPTION OF THE INVENTION

Figure 1:
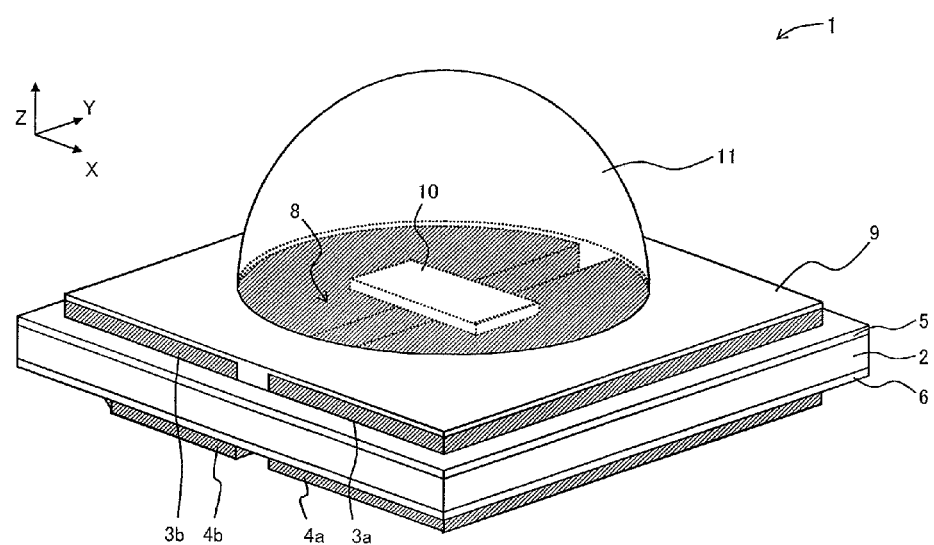
FIG. 1 is a perspective view schematically showing a light-emitting device according to a first embodiment.
Figure 2A:
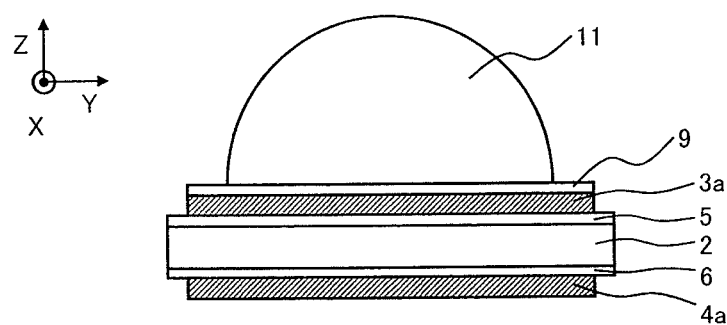
FIGS. 2A and 2B are two side views schematically showing a light-emitting device according to a first embodiment.
Figure 2B:
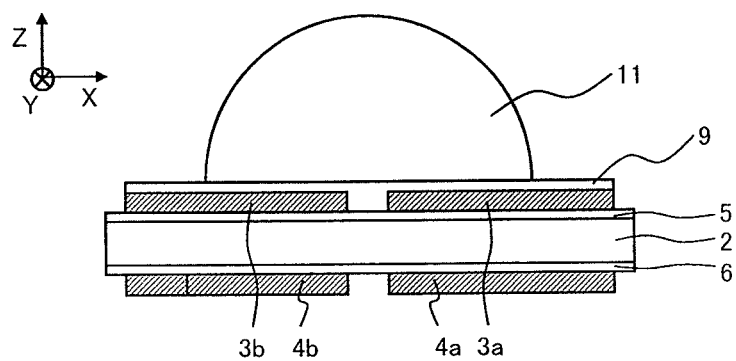
Figure 3A:
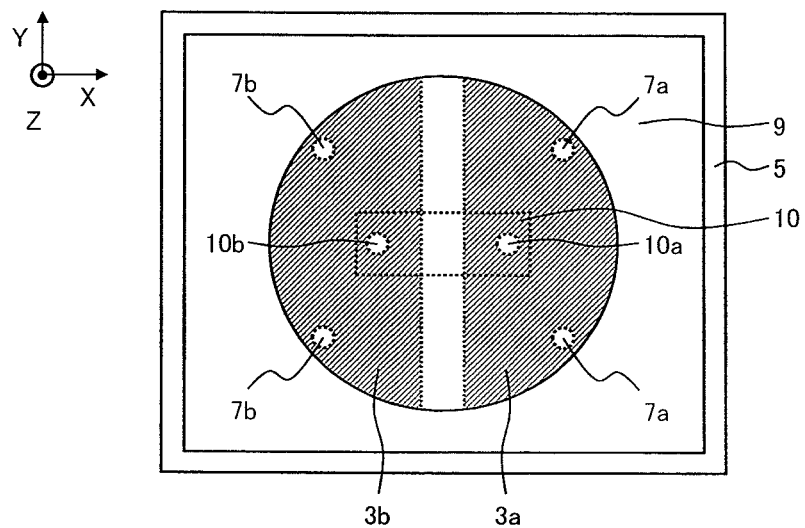
FIGS. 3A and 3B are a plan view and a bottom view schematically showing a light-emitting device according to a first embodiment, respectively.
Figure 3B:
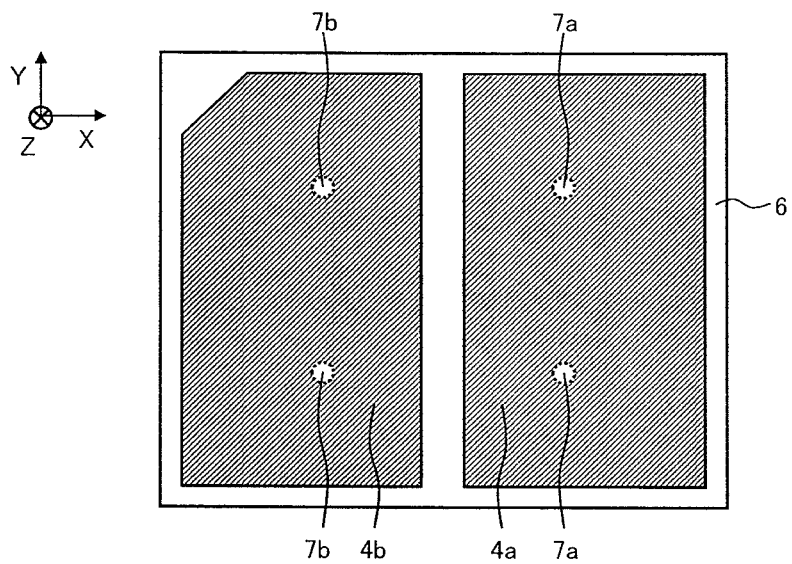

The embodiments of the light-emitting device and manufacturing method therefor according to the present invention are described with reference to the drawings. Here, in the following drawings, the same reference numeral is attached to the same element or part. In addition, in each drawing, since it is shown with an emphasis on the main part to facilitate understanding of the description, the dimensional ratio of each part does not necessarily correspond to the dimensional ratio of real part. Moreover, FIG. 1 to FIG. 12C schematically show one embodiment of each embodiment, and the present invention is not limited to the embodiments shown in the drawings.

FIG. 1, FIGS. 2A and 2B and FIGS. 3A and 3B schematically show a perspective view of a light-emitting device 1 of this embodiment, side views viewed from the X direction and the Y direction and a plan view viewed from the top side and a bottom view viewed from the bottom side, respectively. Hereinafter, the forward direction of the Z direction (direction of the arrow) perpendicular to the X and Y directions is defined as top, and the opposite direction thereof is defined as bottom.

As shown in FIGS. 1 to 3B, the light-emitting device 1 includes a pair of land portions 3a and 3b composed of metal film pieces on the top surface of an insulating film 2 and includes a pair of external connection terminal portions 4a and 4b composed of metal film pieces on the bottom surface, wherein each of the land portions 3a and 3b adheres to the top surface of the insulating film 2 through an adhesive layer 5, and each of the terminal portions 4a and 4b adheres to the bottom surface of the insulating film 2 through an adhesive layer 6. The land portion 3a and the terminal portion 4a are opposed across the insulating film 2, and electrically connected to each other through two through-conductors 7a that penetrate through the insulating film 2. Similarly, the land portion 3b and the terminal portion 4b are opposed across the insulating film 2, and electrically connected to each other through two through-conductors 7b that penetrate through the insulating film 2. The number of the through-conductors 7a and 7b may be 1 or 3 or more, respectively. The pair of the land portions 3a and 3b is electrically insulated and separated from each other by a long and narrow gap extending in the Y direction between the land portions. Similarly, the pair of the terminal portions 4a and 4b is also electrically insulated and separated from each other by a long and narrow gap extending in the Y direction between the terminal portions. In this embodiment, a polyimide film with a film thickness of 0.05 mm is used as an example of the insulating film 2.

On the pair of the land portions 3a and 3b and the gap therebetween, an annular liquid-repellent layer 9 having an opening 8 that exposes a circular area containing a central part of the gap is provided, and a light-emitting element 10 is mounted on the pair of the land portions 3a and 3b in the inside of the opening 8. Furthermore, a phosphor containing silicon resin 11 (phosphor containing resin) that seals the light-emitting element 10 is formed in a dome shape.

In this embodiment, a dice of a blue light-emitting diode made of gallium nitride based compound semiconductor (semiconductor bare chip) is used as the light-emitting element 10. In accordance with this, $CaAlSiN_3$:Eu and $(Si,Al)_6(O,N)_8$Eu are used as phosphor contained in the sealing resin 11. The former is a red phosphor, the latter is a green phosphor, and each absorbs blue emission from the light-emitting element 10 to emit red light and green light, respectively. Thus, blue light that is not absorbed by the phosphor and red light and green light that are emitted from each phosphor are mixed to emit white light from the phosphor containing silicon resin 11.

Furthermore, the light-emitting element 10 is a flip chip type light-emitting element having a P electrode (anode) 10a and an N electrode (cathode) 10b on the chip front surface side and emitting light from the back surface side, wherein the back surface is turned upward and the front surface is opposed to the land portions 3a and 3b, the P electrode 10a and the N electrode 10b are electrically and physically connected to the land portion 3a and the land portion 3b, respectively, through bumps formed on each of electrodes 10a and 10b, and die bonding of the light-emitting element 10 is also performed. As a result, the P electrode 10a, the land portion 3a and the terminal portion 4a are electrically connected to each other, and the N electrode 10b, the land portion 3b and the terminal portion 4b are electrically connected to each other, respectively, and the terminal portion 4a functions as an anode terminal for external connection, and the terminal portion 4b functions as a cathode terminal for external connection. Since the pair of the terminal portions 4a and 4b is formed in line on the same side, this light-emitting device is suitable for surface mounting. Here, in this embodiment, since the terminal portion 4b on the cathode terminal side has a cut-out portion for distinguishing the cathode terminal from the anode terminal, the terminal portion 4b is pentagonal. The land portions 3a and 3b and the terminal portion 4a are squares of the same size, and the terminal portion 4b has a shape in which one corner of the square is cut off. Hereinafter, for convenience, a rectangular region composed of the pair of the land portions 3a and 3b and a gap therebetween is referred to as a "unit section", and the pair of the terminal portions 4a and 4b is formed on the bottom side of the unit section. FIG. 1 to FIG. 3B show one unit section of the light-emitting device 1.

Next, an example of the method for manufacturing a light-emitting device 1 will be described with reference to FIG. 4A to FIG. 5C. All of FIG. 4A to FIG. 5C are process cross-sectional views at a cross section perpendicular to the Y direction in which a light-emitting element 10 is cut.

Figure 4A:
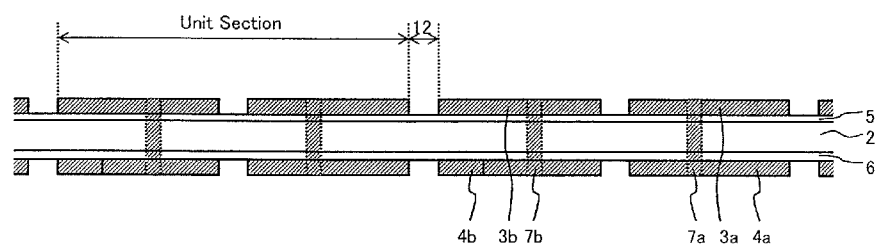
FIGS. 4A, 4B and 4C are process cross-sectional views schematically showing a method for manufacturing a light-emitting device according to a first embodiment.

First, as an example of the insulating film 2, a polyimide film with a film thickness of 0.05 mm and a size of 48 mm×52.25 mm is prepared. A polyimide-based adhesive (adhesive layers 5 and 6) are applied to the both sides of the insulating film 2 in a thickness of about 0.012 mm, and metal laminate films with a film thickness of about 0.025 mm, composed of three layers, Cu, Ni, and Au, formed in this order from the side of the insulating film 2, are adhered to the both sides. Thereafter, an unnecessary part of the metal laminate film is each etched, and a plurality of sets of the pair of the land portions 3a and 3b and the pair of the terminal portions 4a and 4b shown in FIG. 1 to FIG. 3B is each formed on the both sides of the insulating film 2 so as to be arranged in an array form in the X and Y directions. Next, a through-conductor 7a is formed between the land portion 3a and the terminal portion 4a, and a through-conductor 7b is formed between the land portion 3b and the terminal portion 4b, the land portions 3a and 3b and the terminal portion 4a and 4b being opposed across the insulating film 2, respectively. Around one unit section, a cutting region 12 which will be described below (refer to FIG. 7) is formed in a lattice pattern from top view, the metal laminate films are removed from the both sides of the insulating film 2 in the cutting region 12, thus only the insulating film 2 and the adhesive layers 5 and 6 are present. The state after each of the above steps (in two unit sections) is shown in FIG. 4A. Hereinafter, for convenience of ease of description, an insulating film 2 before cutting, in which the land portions 3a and 3b and the terminal portions 4a and 4b are formed on the both sides and the through-conductors 7a and 7b are formed, is referred to as a "laminate substrate".

In this embodiment, on the assumption that the light-emitting element 10 has a chip size of 0.5 mm×0.35 mm, the array pitches of unit section in the X and Y directions are defined as 3.05 mm and 2.55 mm, respectively. When the long side of the insulating film 2 of the above size is taken in the X direction, there are formed 17 unit sections in the X direction, 18 unit sections in the Y direction, and 306 unit sections in total. When the short side is taken in the X direction, the total number of unit sections is 300, thus it is advantageous in terms of cost when the long side is taken in the X direction.

Figure 4B:
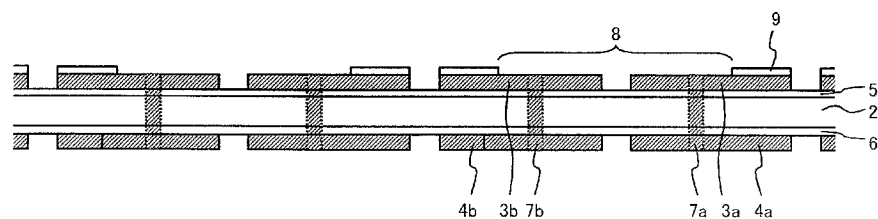

Subsequently, as shown in FIG. 4B, an annular liquid-repellent layer 9 having an opening 8 per a unit section is applied to the inner part of the peripheral four sides of the rectangular region (unit section) composed of the land portions 3a and 3b and a gap therebetween by screen printing or spraying. The liquid-repellent layer 9 has a thickness of about 0.015 mm, and the opening 8 is circular with a diameter of 2 mm. The portions not covered with a sealing resin 11 in the surfaces of the land portions 3a and 3b that are metal laminate films and the insulating film 2 in the unit section are covered with the liquid-repellent layer 9, whereby the land portions 3a and 3b, the insulating film 2, and the light-emitting element 10 can be protected from moisture.

Specifically, a fluorine resin PTFE (polytetrafluoroethylene) is added to an acetone solvent, and the mixture is stirred to obtain a coating solution having an appropriate viscosity, and this coating solution is applied by printing or spraying and cured by drying, to form a liquid-repellent layer 9. Here, the coating solution may be dried only by leaving it at room temperature, and may be dried using an oven as necessary. As the fluorine resin, other than PTFE, PFA (tetrafluoroethylene-perfluoroalkyl vinylether copolymer), FEP (tetrafluoroethylene-hexafluoropropylene copolymer), ETFE (tetrafluoroethylene-ethylene copolymer), PVDF (polyvinylidene fluoride), PCTFE (polychlorotrifluoroethylene) and the like may also be used. In addition, as the solvent, other than acetone, ketone solvents, e.g., methyl ethyl ketone, diethyl ketone, methyl isobutyl ketone and the like, and ester solvents, e.g., methyl acetate, ethyl acetate, butyl acetate and the like, may be used. Furthermore, the liquid-repellent layer 9 of the above materials has gas barrier properties, and also has an effect that the land portions 3a and 3b made of metal are also protected from gas.

Figure 4C:
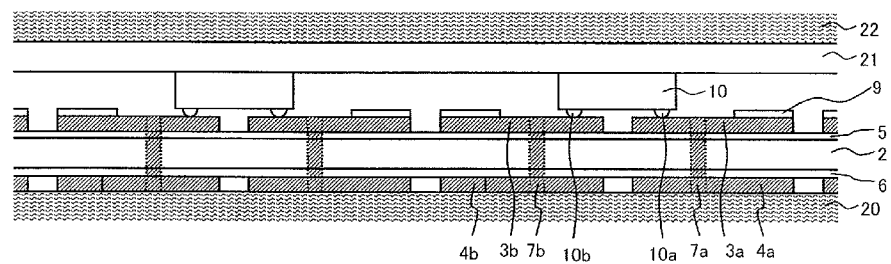

Subsequently, as shown in FIG. 4C, a constitution obtained by mounting on a heating stage 20 a laminate substrate in which the liquid-repellent layer 9 is formed, and adhering the light-emitting elements 10 as many as the unit sections on the insulating film 2 onto a sheet 21 with the same number of arrays and the same array pitches in the X direction and the Y direction, with the back surface side (light-emitting surface side) facing the side of the sheet 21, is prepared. The sheet 21 is fixed on a sheet fixing tool 22. Each of electrodes 10a and 10b on the front surface of each light-emitting element 10 faces downward and is opposed to the land portions 3a and 3b in each unit section. The constitution is heated by the heating stage 20, for example, at 300° C., and the P electrode 10a and the N electrode 10b are electrically and physically connected to the land portion 3a and the land portion 3b, respectively, through bumps formed on each of electrodes 10a and 10b, and the light-emitting element 10 is moved to the side of the land portions 3a and 3b. As a result, the light-emitting element 10 and the land portions 3a and 3b are adhered to each other, and die bonding is also performed. Here, the heating stage 20 may be provided, for example, on the side of the sheet fixing tool 22, not at the position in which the insulating film 2 is mounted.

Figure 5A:
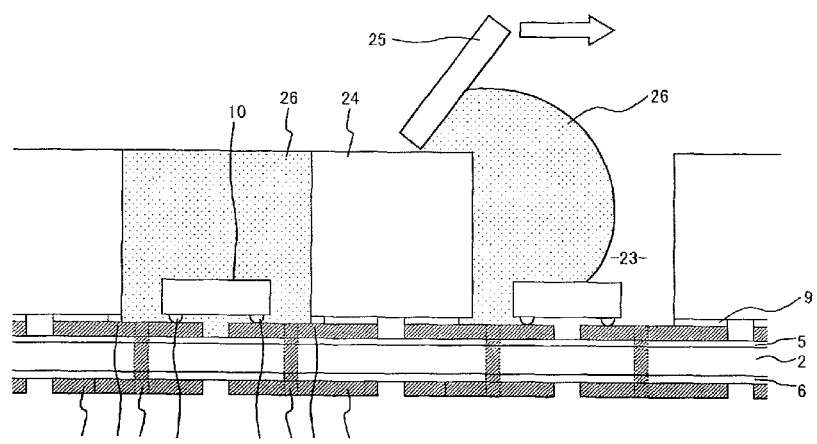
FIGS. 5A, 5B and 5C are process cross-sectional views schematically showing a method for manufacturing a light-emitting device according to a first embodiment.
Figure 6:
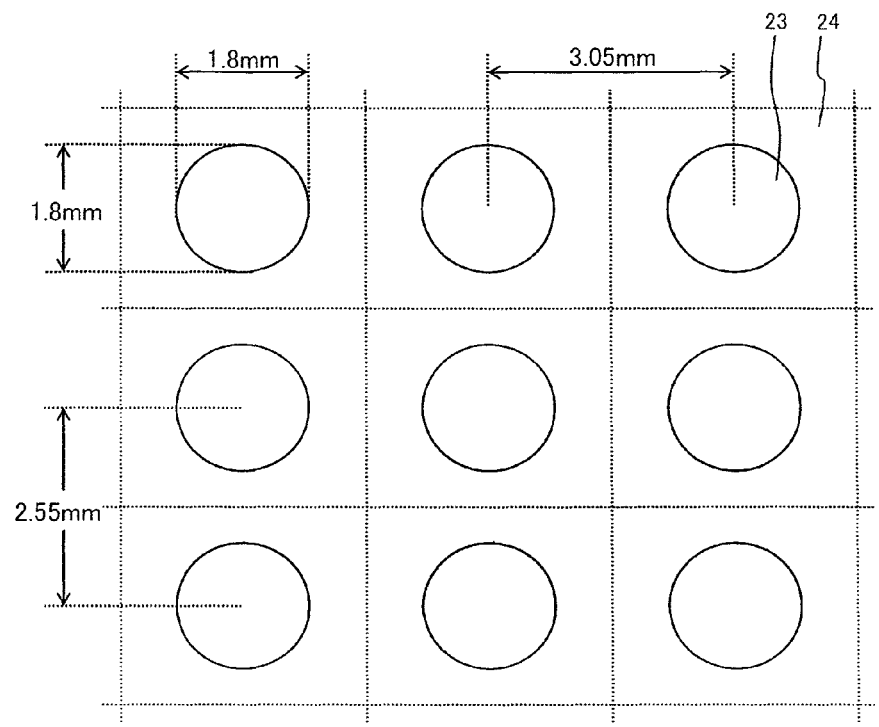
FIG. 6 is a plan view schematically showing a structure of a metal mask used in a method for manufacturing a light-emitting device.

Subsequently, a metal mask 24 (mask member) in which circular openings 23 as many as the unit sections on the insulating film 2 are provided with the same number of arrays and the same array pitches in the X and Y directions is prepared, and as shown in FIG. 5A, alignment between the metal mask 24 and the laminate substrate in which the liquid-repellent layer 9 is formed is carried out such that the light-emitting element 10 is located in the center of the opening 23, and the metal mask 24 is mounted on the insulating film 2 in which the liquid-repellent layer 9 is formed, and a silicon resin 26 containing the two types of red phosphor and green phosphor is uniformly injected into the openings 23 while sliding a squeegee 25 in the lateral direction (for example, the X direction or the Y direction) by a squeegee printing method using the squeegee 25. The metal mask 24 has a film thickness of 1.8 mm, and as shown in FIG. 6, the number of arrays and the array pitches of the openings 23 in the X and Y directions are, as the same as the unit section, 17 at 3.05 mm pitch in the X direction, and 18 at 2.55 mm pitch in the Y direction. However, FIG. 6 shows only 3 rows×3 columns of the openings 23. The opening 23 has a diameter of 1.8 mm, that is smaller than a diameter of the opening 8 in the liquid-repellent layer 9 of 2 mm, and the top surface of the liquid-repellent layer 9 is completely covered by the metal mask 24. For reference, in FIG. 6, the centerline of the cutting region 12 is virtually shown by dotted lines in a lattice pattern.

Figure 5B:
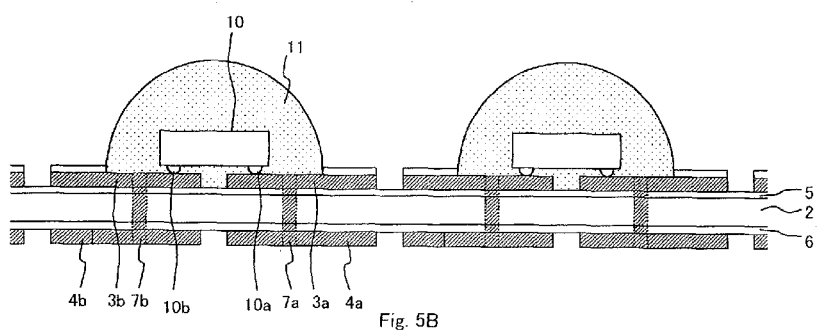

Subsequently, after the phosphor containing silicon resin 26 is injected into all of the openings 23, when the metal mask 24 is removed upward, the silicon resin 26 injected into each opening 23 diffuses in the lateral direction (radial direction of the opening 8). However, as shown in FIG. 5B, the silicon resin 26 is naturally formed in a convex-upward dome shape, due to liquid repellency of the liquid-repellent layer 9, surface tension of the sealing resin 26, and interfacial tension of the silicon resin 26 with a metal constituting the land portions 3a and 3b. The dome is formed in an approximate hemispherical shape having a circular bottom with a diameter of 2 mm and a height of about 1.3 mm.

Next, when the silicon resin 26 is thermally cured, for example, by heat treatment in an oven at a temperature range of 80° C. to 150° C. for a few minutes, a dome-shaped phosphor containing silicon resin 11 is formed as shown in FIG. 5B. Thus, the light-emitting element 10 is resin-sealed with the phosphor containing silicon resin 11. Subsequently, after-curing is carried out for a laminate substrate in which the dome-shaped phosphor containing silicon resin 11 is formed, for example, at high temperature conditions of 150° C.

Figure 5C:
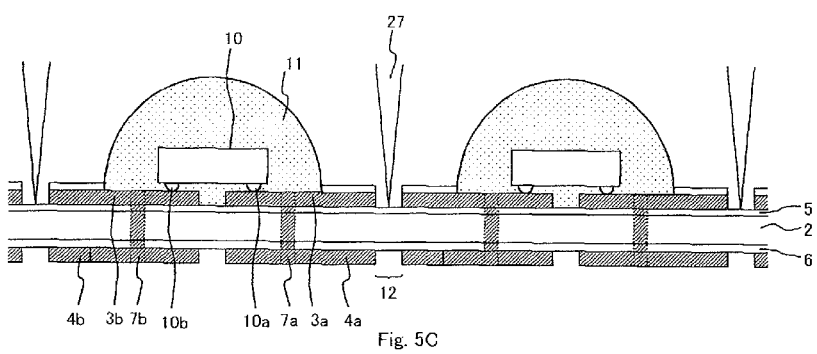
Figure 7:
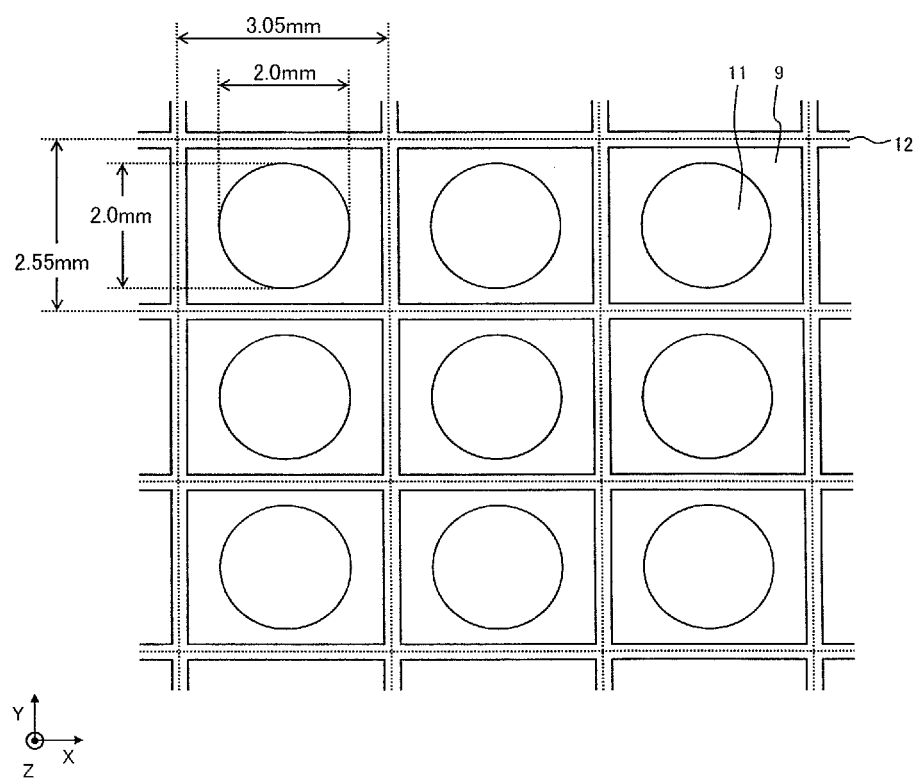
FIG. 7 is a plan view schematically showing the state before singulation of a light-emitting device according to a first embodiment.

At this point, as shown in FIG. 7, 306 of surface mount light-emitting devices 1 in which the light-emitting element 10 is sealed with the dome-shaped phosphor containing silicon resin 11 are fixed on the insulating film 2, in a state arranged in an array form (17 rows×18 columns). FIG. 7 shows only 3 rows×3 columns of 306 devices. Subsequently, as shown in FIG. 5C, the insulating film 2 is cut along the centerline (shown by dotted lines in FIG. 7) of the cutting region 12 in a lattice pattern, using a splicer 27 with a blade thickness of 0.2 mm, to separate (singulate) it into 306 of light-emitting devices 1. As cutting methods, any of a method of cutting the insulating film 2 along the cutting region 12 one by one, for example, cutting the insulating film 2 along the cutting region 12 extending in the X direction (or the Y direction), then cutting the insulating film 2 along the cutting region 12 extending in the Y direction (or the X direction) (first method), a method of cutting the insulating film 2 along all the cutting region 12 extending in the Y direction using a tool in which blades of the splicer 27 are disposed in parallel at an interval of 3.05 mm, and then cutting the insulating film 2 along all the cutting region 12 extending in the X direction using a tool in which blades of the splicer 27 are disposed in parallel at an interval of 2.55 mm (the order of cutting in the X direction and the Y direction may be switched) (second method), and a method of cutting the insulating film 2 at a time, using a tool in which blades of the splicer 27 are constituted at an interval of 3.05 mm in the X direction and at an interval of 2.55 mm in the Y direction in a lattice pattern (third method) may be used. Here, the number of the blades of the splicer 27 arranged in parallel may be determined depending on the size of a margin of the insulating film 2 corresponding to the external part of a region containing all unit sections of 17 rows×18 columns. When the margin is large, cutting for separating the margin (a blade of the splicer 27) is necessary. When there is no margin, or the margin is small as compared to the width of the cutting region 12, the cutting for separation is not necessary.

When the cutting region 12 is all removed by the singulation in a case where the width of the cutting region 12 is 0.2 mm, there is no extrusion from the unit section of the insulating film 2 as shown in FIG. 1 to FIG. 3B. When only a part of the cutting region 12 is removed by the singulation, or a removal part is not generated by cutting, there remains an extrusion from the unit section of the insulating film 2 as shown in FIG. 1 to FIG. 3B.

Here, even if any cutting method of the first to third methods is used, only the insulating film 2 made of a polyimide film with a film thickness of 0.05 mm is cut. Therefore, a dicing machine requiring expensive incidental facilities does not have to be used, and manufacturing cost can be reduced for that. In addition, in the first method, a commercially available simple cutting tool such as a box cutter, a roller cutter or a rotary cutter can be used. Also, since dust, small chips and the like generated by cutting are reduced, adhesion of the dust and small chips to the sealing resin surface is also reduced, and the effect on luminance and chromaticity is reduced.

Figure 8:
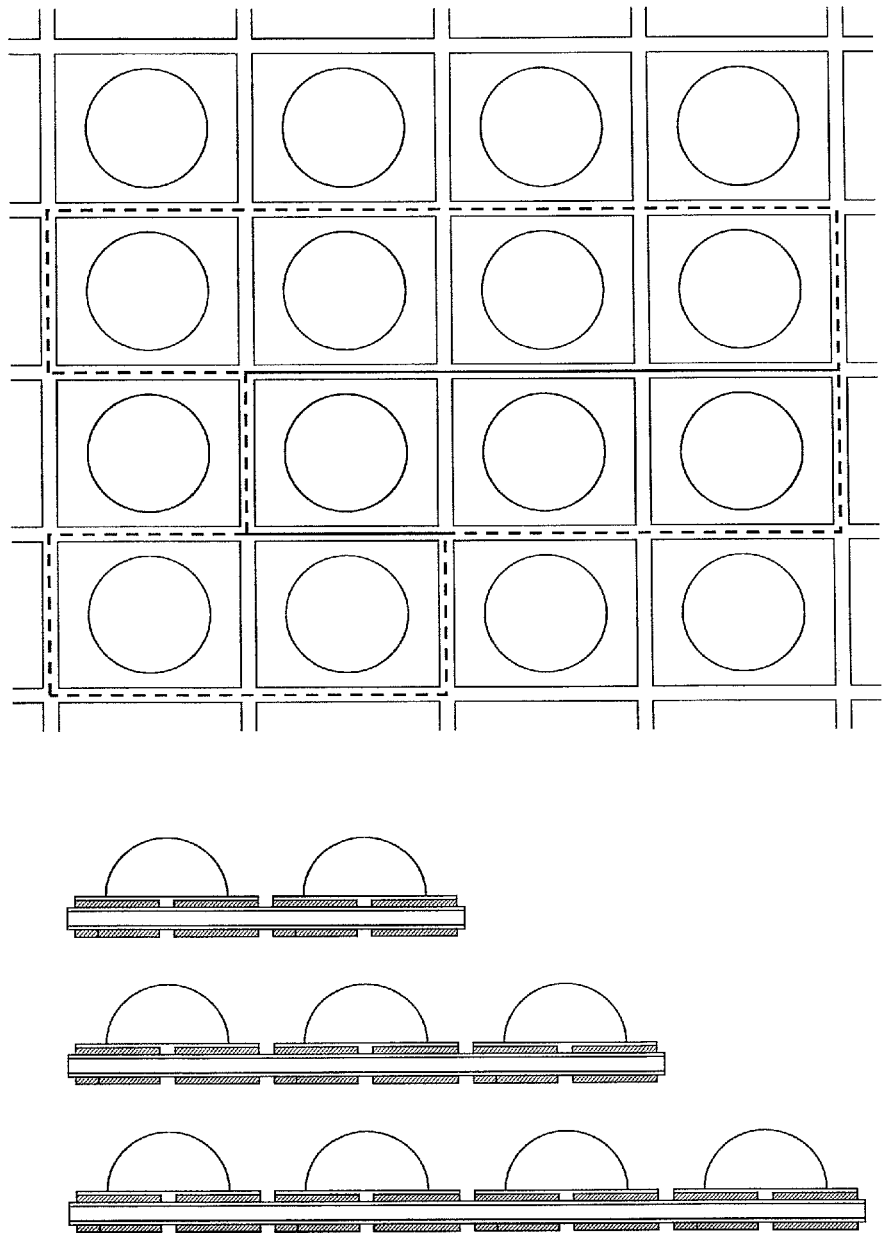
FIG. 8 is a plan view and a side view schematically showing a light-emitting device in which double, triple and quadruple unit sections are singulated as a one group, and singulation processes thereof.

In the example shown in FIG. 5C, a case of making an individual piece of one unit section by cutting is described, but the individual piece may have two or more unit sections. In this embodiment, singulation can be easily achieved by a simple step of merely cutting the insulating film 2 with a box cutter or the like. Therefore, as shown in FIG. 8, a light-emitting device provided with a plurality of light-emitting elements 10 can be prepared by defining double, triple or quadruple unit sections as one group and cutting the insulating film 2 along cutting lines (indicated by bold dashed lines in the drawing) in the cutting region around each group. In addition, since the singulation process is easy in the method for manufacturing a light-emitting device of this embodiment, it is also possible to ship in the state before singulation and carry out the singulation process on the part of the user. Specifically, there is an advantage that a light-emitting device composed of the number and layout of unit sections depending on the intended use on the part of the user can be freely prepared.

Figure 9A:
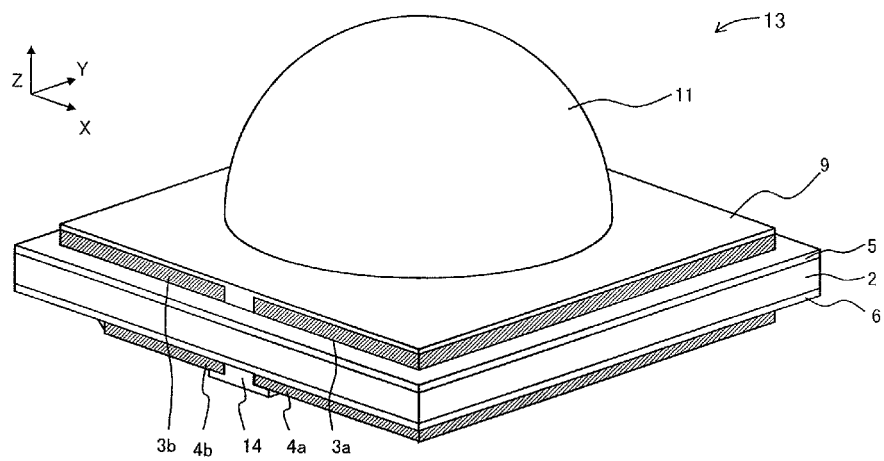
FIGS. 9A, 9B and 9C are a perspective view, a side view and a bottom view schematically showing a light-emitting device according to a second embodiment, respectively.
Figure 9B:
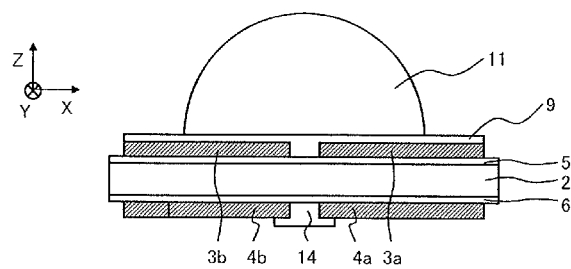
Figure 9C:
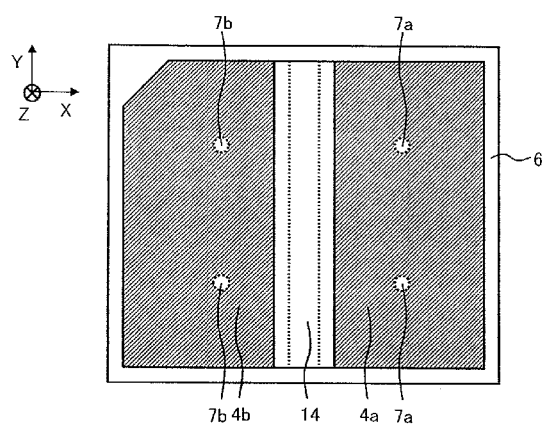

FIGS. 9A to 9C schematically show a perspective view (FIG. 9A), a side view viewed from the Y direction (FIG. 9B), and a bottom view viewed from the bottom side (FIG. 9C) of a light-emitting device 13 of the second embodiment, respectively.

The light-emitting device 13 of the second embodiment is different from the light-emitting device 1 described in the first embodiment in the following two points. First, it is different in that a reinforcement material 14 is filled in a gap between a pair of the terminal portions 4a and 4b in one unit section. Second, a method of injecting the silicon resin 26 into the openings 23 of the metal mask 24 described in FIG. 5A is different. Since the light-emitting device 13 is same as the light-emitting device 1 described in the first embodiment other than the above two differences, a duplicate description is omitted.

First, the reinforcement material 14 will be described. The laminate substrate in which the land portions 3a and 3b and the terminal portions 4a and 4b are formed on the both surfaces of the insulating film 2 requires reinforcement since only the insulating film 2 is present between the land portions 3a and 3b and between the terminal portions 4a and 4b. In the first embodiment, the liquid-repellent layer 9 is formed on the land portions 3a and 3b, and the light-emitting element 10 is die-bonded across the land portions 3a and 3b in the opening 8, and a part of the liquid-repellent layer 9 and a part of the silicon resin 11 are filled into the gap between the land portions 3a and 3b. Therefore, a certain level of reinforcement is made in the top side of the insulating film 2. However, since the gap between the terminal portions 4a and 4b remains to be present in the bottom side of the insulating film 2, further reinforcement is possible.

Therefore, in the second embodiment, the same coating solution as that used in the formation of the liquid-repellent layer 9 is filled in the gap between the terminal portions 4a and 4b, and is applied by printing or spraying, and cured by drying, so as to cover the ends of the terminal portions 4a and 4b on the both side of the gap, to reinforce the bottom side of the insulating film 2. Thus, reinforcement is made in the top and bottom of the insulating film 2 between the land portions 3a and 3b and between the terminal portions 4a and 4b, thus the part becomes a difficulty deformable part, and is difficult to deform even if external mechanical stress is applied. Moreover, an electrical connection between the light-emitting element 10 and the land portions 3a and 3b and insulation properties between the terminal portions 4a and 4b are more certainly assured.

In the second embodiment, since the same material as the liquid-repellent layer 9 is used as the reinforcement material 14, the material can be efficiently used. In addition, since the reinforcement material 14 has liquid repellency, solder can be prevented from flowing and adhering to both the terminal portions 4a and 4b when the light-emitting device 13 is soldered on other printed substrate or the like. Furthermore, as shown in FIGS. 9A and 9B, since the reinforcement material 14 is slightly projected downward from the bottom surfaces of the terminal portions 4a and 4b, the projection becomes a jetty for preventing solder from flowing when the light-emitting device is soldered on other substrate, thus short circuit between the terminal portions 4a and 4b by soldering can be prevented. Since the step of forming the reinforcement material 14 is same as the step of forming the liquid-repellent layer 9, a duplicate description is omitted. Here, since the main object of the reinforcement material 14 is to reinforce the bottom side of the insulating film 2, it is not necessary to use the same material as the liquid-repellent layer 9, and other materials may be used as long as they are an insulating material.

Next, a method of injecting the silicon resin 26 into the openings 23 of the metal mask 24 in the second embodiment will be described. The steps before the injection of the silicon resin 26 are the same as in the first embodiment.

In the second embodiment, the injection of the silicon resin 26 into the openings 23 is carried out by a potting method, not the squeegee printing method used in the first embodiment. In addition, a liquid-repellent film 28 is formed on the inner wall of the opening 23 of the metal mask 24. The liquid-repellent film 28 is previously formed by applying a coating liquid of the same material as the liquid-repellent layer 9 to the inner wall of the opening 23 and curing it by drying. The film thickness of the metal mask 24, the number of arrays, array pitch and diameter of the openings 23 and the like are the same as in the first embodiment.

Figure 10A:
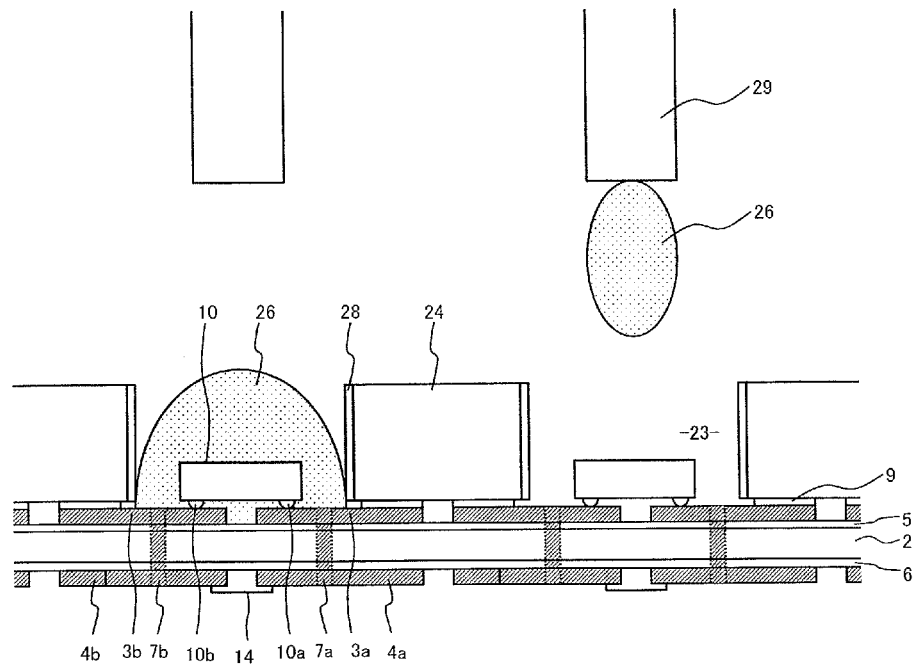
FIGS. 10A and 10B are process cross-sectional views schematically showing a main section of a method for manufacturing a light-emitting device according to a second embodiment.
Figure 10B:
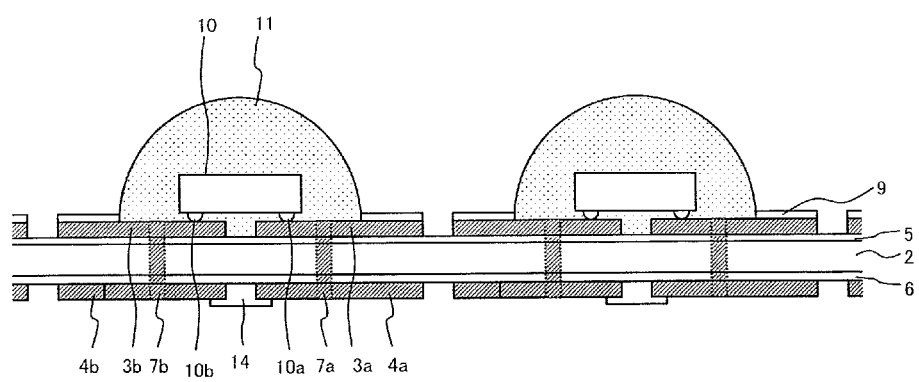

As shown in FIG. 10A, alignment between the metal mask 24 and the insulating film 2 is carried out such that the light-emitting element 10 is located in the center of the opening 23, and the metal mask 24 is mounted on the insulating film 2 in which the liquid-repellent layer 9 is formed, and the silicon resin 26 containing the two types of red and green phosphor is uniformly injected into the openings 23. A dispenser for potting the silicon resin 26 is provided with 17 nozzles 29 at an interval of 3.05 mm, and the silicon resin 26 is discharged at a time to 17 openings 23 arranged at a pitch of 3.05 mm in the X direction. The discharge is repeated for 18 times while the nozzles 29 are shifted by 2.55 mm in the Y direction, so that the silicon resin 26 is injected into all of the openings 23. As shown in FIG. 10A, at this point, the silicon resin 26 is naturally formed in a convex-upward dome shape, due to liquid repellency of the liquid-repellent film 28, surface tension of the sealing resin 26, and interfacial tension of the silicon resin 26 with a metal constituting the land portions 3a and 3b. Subsequently, after the phosphor containing silicon resin 26 is injected into all of the openings 23, when the metal mask 24 is removed upward, the dome-shaped silicon resin 26 injected into each opening 23 diffuses in the lateral direction (radial direction of the opening 8). As shown in FIG. 10B, the silicon resin 26 is naturally formed in a convex-upward dome shape, due to liquid repellency of the liquid-repellent layer 9, surface tension of the sealing resin 26, and interfacial tension of the silicon resin 26 with a metal constituting the land portions 3a and 3b. The dome is formed in an approximate hemispherical shape having a circular bottom with a diameter of 2 mm and a height of about 1.3 mm.

Next, in the same manner as in the first embodiment, when the silicon resin 26 is thermally cured, for example, by heat treatment in an oven at a temperature range of 80° C. to 150° C. for a few minutes, a dome-shaped phosphor containing silicon resin 11 is formed as shown in FIG. 10B. Thus, the light-emitting element 10 is resin-sealed with the phosphor containing silicon resin 11. Subsequently, after-curing is carried out for a laminate substrate in which the dome-shaped phosphor containing silicon resin 11 is formed, for example, at high temperature conditions of 150° C. At this point, in the same manner as in the first embodiment, as shown in FIG. 7, 306 of surface mount light-emitting devices 1 in each of which the light-emitting element 10 is sealed with the dome-shaped phosphor containing silicon resin 11 are prepared in a state arranged in an array form (17 rows×18 columns) and fixed on the insulating film 2. Since then, in the same manner as in the first embodiment, the insulating film 2 is cut along the cutting region 12 to prepare a light-emitting device 1 singulated as one or a plurality of the unit sections.

When the cutting region 12 is all removed by the singulation in a case where the width of the cutting region 12 is 0.2 mm, there is no extrusion from the unit section of the insulating film 2 as shown in FIG. 9. When only a part of the cutting region 12 is removed by the singulation, or a removal part is not generated by cutting, there remains an extrusion from the unit section of the insulating film 2 as shown in FIG. 9.

Figure 11A:
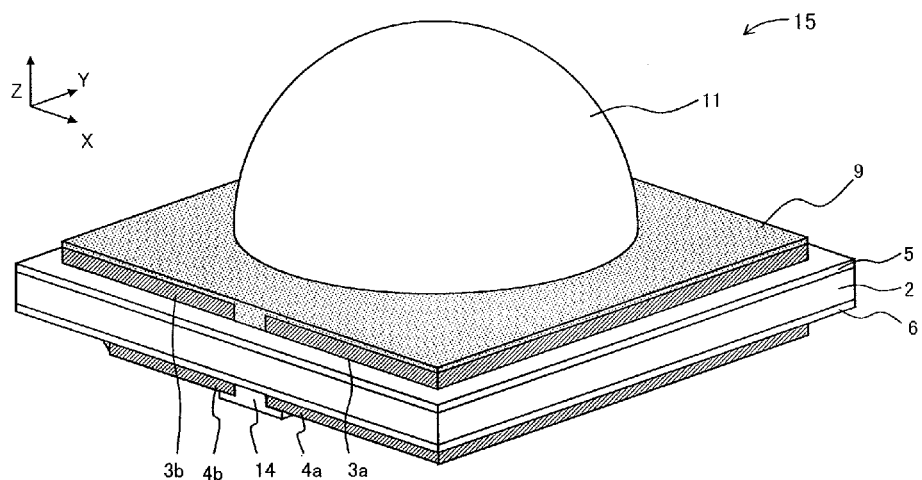
FIGS. 11A, 11B and 11C are a perspective view, a side view and a bottom view schematically showing a light-emitting device according to a third embodiment, respectively.
Figure 11B:
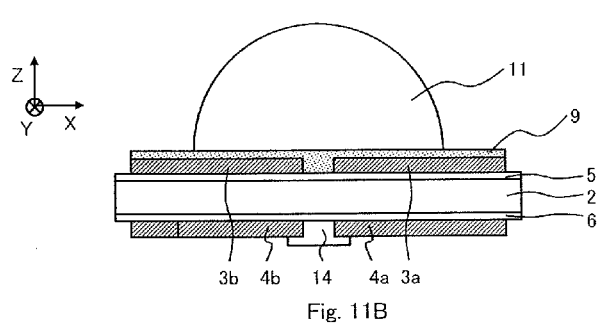
Figure 11C:
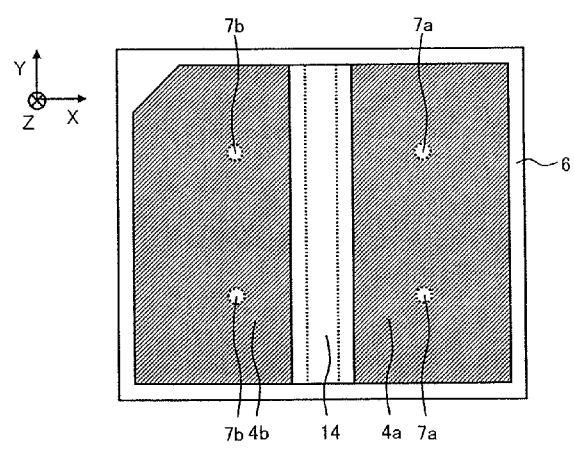

FIGS. 11A to 11C schematically show a perspective view (FIG. 11A), a side view viewed from the Y direction (FIG. 11B), and a bottom view viewed from the bottom side (FIG. 11C) of a light-emitting device 15 of the third embodiment, respectively.

The light-emitting device 15 of the third embodiment is different from the light-emitting device 1 described in the first embodiment in the following four points. First, it is different in that a reinforcement material 14 is filled in a gap between a pair of the terminal portions 4a and 4b in one unit section. Second, it is different in that the liquid-repellent layer 9 contains phosphor. Third, it is different in that a wire-bonding type light-emitting element having bonding pads of a P electrode (anode) 10a and an N electrode (cathode) 10b on the chip front surface side, emitting light from the front surface side, and having an insulating substrate such as sapphire on the back surface side is used as a light-emitting element 10, not a flip chip type light-emitting element. Furthermore, the connection method between the light-emitting element 10 and the land portions 3a and 3b is different by a difference in the structure of the light-emitting element 10. However, it is the same as in the first and second embodiments in that the light-emitting element 10 is a blue light-emitting diode. Fourth, a method of injecting the silicon resin 26 into the openings 23 of the metal mask 24 described in the FIG. 5A is different. Since the light-emitting device 15 is the same as the light-emitting device 1 described in the first embodiment other than the above four differences, and the first difference is the same as the difference described in the second embodiment, a duplicate description is omitted.

First, the second difference will be described. In the first and second embodiments, since the liquid-repellent layer 9 has very thin film thickness and thus is colorless, it is difficult to visually confirm the shape of the liquid-repellent layer 9, the position of the opening 8, and the like. Therefore, in the third embodiment, in order to facilitate visual confirmation of the shape of the liquid-repellent layer 9 and the like, a coating solution containing phosphor particles is used. Here, in the third embodiment, $(Ba,Sr)_2SiO_4:Eu$, a yellow phosphor, is used as an example of the phosphor. The yellow phosphor emits yellow light when it is irradiated with a light having a wavelength of 400 nm to 450 nm, thus visual confirmation of the shape of the liquid-repellent layer 9 and the like is facilitated. Here, since the particles of yellow phosphor have a particle size of about 10 μm, the film thickness of the liquid-repellent layer 9 is preferably, for example, 0.015 mm or more, due to the necessity to be equal to or larger than the particle size. Since the method of forming the liquid-repellent layer 9 is the same as in the first embodiment except that phosphor is contained in the coating solution, and the coating solution is applied and dried by the method described in the first embodiment, a duplicate description is omitted. Here, the emission color of the phosphor contained in the liquid-repellent layer 9 is not limited to yellow. For example, it is also preferable to change the emission color of the phosphor, depending on the characteristics of the mounted light-emitting element 10.

In the third embodiment, the liquid-repellent layer 9 emits yellow light by irradiating a light having a wavelength of 400 nm to 450 nm (blue light), and visual confirmation is facilitated, thereby offering the following advantages. First, in the wire-bonding method which will be described below, when the liquid-repellent layer 9 is accidentally applied to the region connected to one end of a bonding wire 30 on the land portions 3a and 3b, it is wire bonding defects. However, since application defect in the liquid-repellent layer 9 can be confirmed in advance before wire bonding process, by irradiating the liquid-repellent layer 9 with blue light, exclusion of a unit section with the application defect, adjustment of shifting a wire bonding position to a region to which the liquid-repellent layer 9 is not applied or the like is possible. Second, since prior confirmation of the application defect is possible, margin of layout design of the pattern of the land portions 3a and 3b and the pattern of the liquid-repellent layer 9 attributable to the application accuracy of the liquid-repellent layer 9 can be reduced, and layout design at a higher density is possible. Third, it is available to inspect the coating state of the liquid-repellent layer 9. Fourth, the efficiency and accuracy upon alignment between the laminated substrate and the metal mask 24 in which the liquid-repellent layer 9 is formed are improved.

Figure 12A:
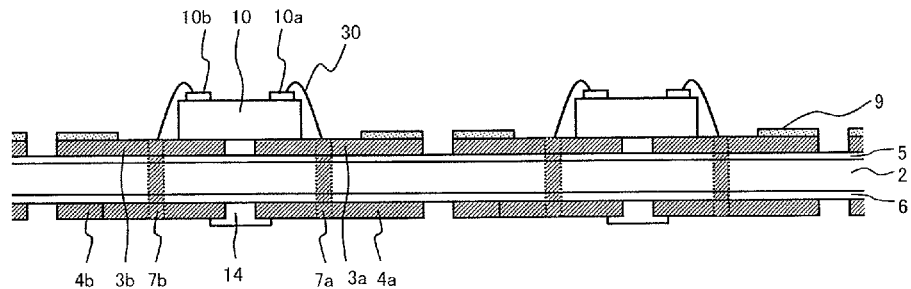
FIGS. 12A, 12B and 12C are process cross-sectional views schematically showing a main section of a method for manufacturing a light-emitting device according to a third embodiment.

Next, the third difference will be described. As shown in FIG. 12A, the connection between the light-emitting element 10 and the land portions 3a and 3b is made by a well-known wire-bonding method. Specifically, with the front surface of the light-emitting element 10 facing upward, the back surface is opposed to the land portions 3a and 3b, and the light-emitting element 10 is die-bonded on the land portions 3a and 3b across the gap between the land portions 3a and 3b. Then, a bonding pad of the P electrode 10a and a bonding pad of the N electrode 10b are connected to the land portion 3a and the land portion 3b, respectively, using the bonding wire 30.

Then, the fourth difference will be described. In the third embodiment, while the injection of the silicon resin 26 into the openings 23 of the metal mask 24 is carried out by a squeegee printing method in the same manner as in the first embodiment, the used metal mask 24 is different from that in the first embodiment. In the third embodiment, a liquid-repellent film 28 is formed in the lower part of the inner wall of the opening 23. In the second embodiment, the metal mask 24 in which a liquid-repellent film 28 is formed on the whole surface of the inner wall of the opening 23 is used. In the third embodiment, the metal mask 24 in which a liquid-repellent film 28 is formed in the lower part of the inner wall of the opening 23 or the same metal mask 24 as the one used in the second embodiment can be used.

Figure 12B:
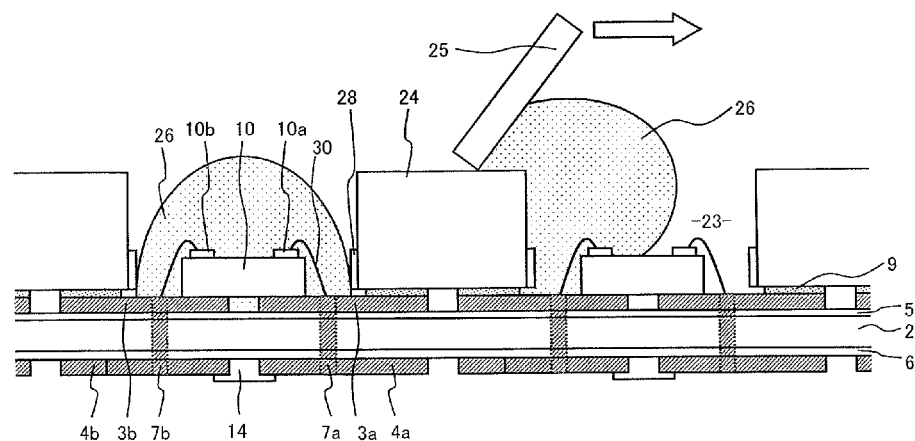
Figure 12C:
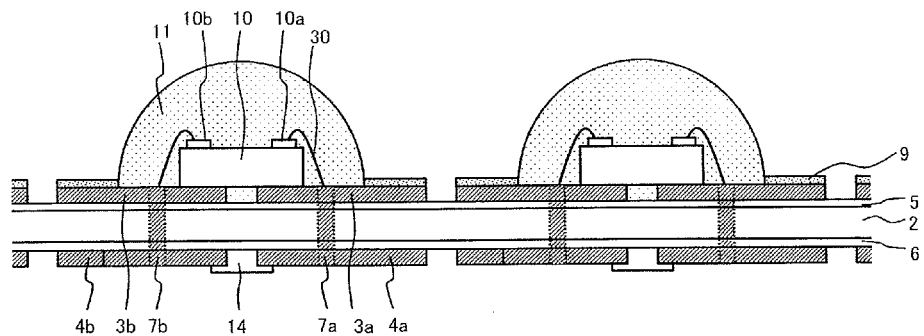
Figure 13:
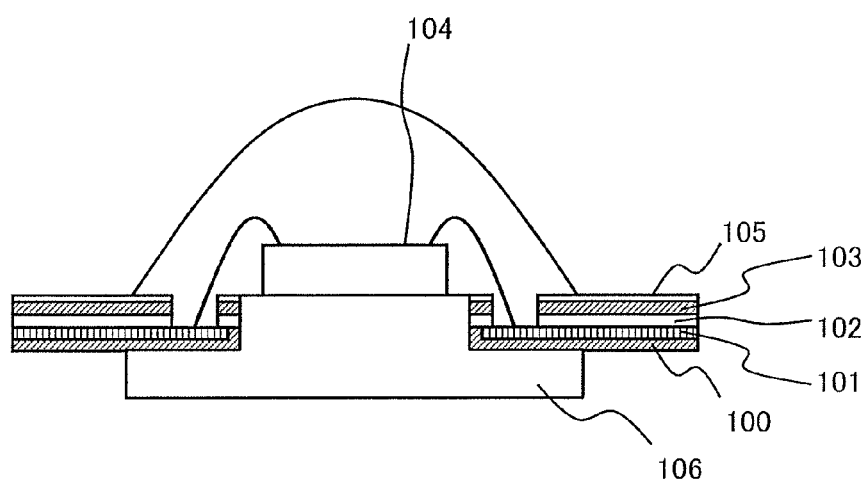
FIG. 13 is a cross-sectional view schematically showing an example of a conventional light-emitting device.
Figure 14:
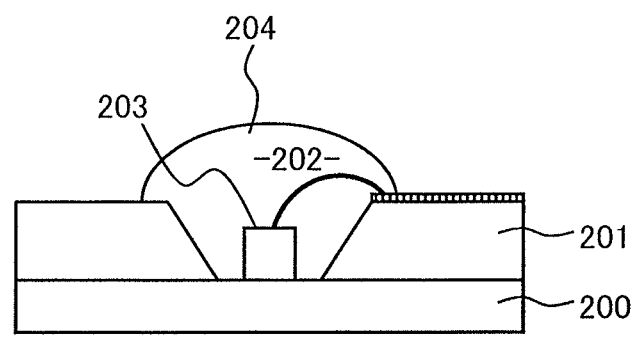
FIG. 14 is a cross-sectional view schematically showing another example of a conventional light-emitting device.

In the first embodiment, since a liquid-repellent film 28 is not formed on the inner wall of the metal mask 24, the silicon resin 26 immediately after injected maintains a cylindrical form in the opening 23. However, in the third embodiment, as shown in FIG. 12B, the silicon resin 26 is naturally formed in a convex-upward dome shape, due to liquid repellency of the liquid-repellent film 28, surface tension of the sealing resin 26, and interfacial tension of the silicon resin 26 with a metal constituting the land portions 3a and 3b. Subsequently, after the phosphor containing silicon resin 26 is injected into all of the openings 23, when the metal mask 24 is removed upward, the dome-shaped silicon resin 26 injected into each opening 23 diffuses in the lateral direction (radial direction of the opening 8). As shown in FIG. 12C, the silicon resin 26 is naturally formed in a convex-upward dome shape, due to liquid repellency of the liquid-repellent layer 9, surface tension of the sealing resin 26, and interfacial tension of the silicon resin 26 with a metal constituting the land portions 3a and 3b. The dome is formed in an approximate hemispherical shape having a circular bottom with a diameter of 2 mm and a height of about 1.3 mm.

Next, when the silicon resin 26 is thermally cured, for example, by heat treatment in an oven at a temperature range of 80° C. to 150° C. for a few minutes, a dome-shaped phosphor containing silicon resin 11 is formed as shown in FIG. 12C. Thus, the light-emitting element 10 is resin-sealed with the phosphor containing silicon resin 11. Subsequently, after-curing is carried out for a laminate substrate in which the dome-shaped phosphor containing silicon resin 11 is formed, for example, at high temperature conditions of 150° C. At this point, in the same manner as in the first embodiment, as shown in FIG. 7, 306 of surface mount light-emitting devices 1 in each of which the light-emitting element 10 is sealed with the dome-shaped phosphor containing silicon resin 11 are prepared in a state arranged in an array form (17 rows×18 columns) and fixed on the insulating film 2. Since then, in the same manner as in the first embodiment, the insulating film 2 is cut along the cutting region 12 to prepare a light-emitting device 1 singulated as one or a plurality of the unit sections.

When the cutting region 12 is all removed by the singulation in a case where the width of the cutting region 12 is 0.2 mm, there is no extrusion from the unit section of the insulating film 2 as shown in FIG. 11. When only a part of the cutting region 12 is removed by the singulation, or a removal part is not generated by cutting, there remains an extrusion from the unit section of the insulating film 2 as shown in FIG. 11.

Next, other embodiments of the above embodiments will be described.

(1) In the above embodiments, a polyimide film with a film thickness of 0.05 mm is used as the material of the insulating film 2. However, other than the polyimide film, for example, a bismaleimide triazine resin film, a liquid crystal polymer film or the like may also be used. In addition, the film thickness of the insulating film 2 is also not limited to 0.05 mm, and in a material with higher strength, the film thickness can be made thinner than 0.05 mm. It is also possible to thicken the film thickness in a range where the insulating film 2 is easily cut by the above splicer or a simple cutting tool.

(2) In the above embodiments, metal laminate films are adhered to the both sides of the insulating film 2 through the adhesive layers 5 and 6, then an unnecessary part is etched, and the land portions 3a and 3b and the terminal portions 4a and 4b are formed. However, in place of the formation method, metal laminate films in which the land portions 3a and 3b and the terminal portions 4a and 4b are previously patterned may be adhered to the both sides of the insulating film 2.

(3) In the above embodiments, the embodiment in which a blue light-emitting diode is used as the light-emitting element 10 and the light-emitting element 10 is sealed with the silicon resin 11 containing a red phosphor and a green phosphor (white light-emitting device) is described. However, the present invention is also applicable to a light-emitting device other than white light-emitting device, thus a light-emitting diode with a light emission color (light emission wavelength) other than that of a blue light-emitting diode may be used as the light-emitting element 10, the silicon resin 11 may be made into a transparent sealing resin without containing phosphor, or phosphor other than the red phosphor and the green phosphor may be used as the phosphor contained in the sealing resin 11. However, the light emission wavelength of the phosphor is necessary to be longer than the light emission wavelength of the light-emitting element 10.

(4) In the above embodiments, the case where one light-emitting element 10 is mounted in one unit section is described. However, a plurality of dice of the light-emitting elements 10 may be mounted in one unit section.

In addition, in the above embodiments, the case where the same light-emitting element 10 is mounted in each unit section on the laminate substrate is described. However, different light-emitting elements (for example, light-emitting diodes having different light emission wavelengths) may be mounted in one unit section and other unit section, respectively, on the same laminate substrate.

(5) The shape and dimension of each portion described in the above embodiments are an example, and can be changed depending on, for example, the chip size of the light-emitting element 10 or the like. In addition, the shapes of the opening 8 of the liquid-repellent layer 9 and the opening 23 of the metal mask 24 are not limited to a circle, but may be, for example, an ellipse.

(6) Anther embodiment that adopts either one of the two differences from the first embodiment as shown in the above second embodiment and conforms the other difference to the first embodiment is also possible. In addition, another embodiment that adopts any one to three differences of one to four differences and conforms the rest to the first embodiment is also possible. Furthermore, in the third embodiment or another embodiment of the third embodiment, a method of injecting the silicon resin 26 into the openings 23 of the metal mask 24 of the fourth difference may be changed to a method of the second difference in the second embodiment.

(7) In the above embodiments, while two types of structures, a flip chip type light-emitting element and a wire-bonding type light-emitting element, are exemplified as the light-emitting element 10, the light-emitting element 10 may be a light-emitting element having a structure in which the whole surface of the chip back surface side is an N electrode (cathode) 10b, and a P electrode (anode) 10a is formed on the chip front surface side, to emit light from the front surface side. However, in this case, the light-emitting element 10 is electrically and mechanically connected only to the land portion 3b by die bonding, and the P electrode (anode) 10a of the light-emitting element 10 is connected to the land portion 3a through wire bonding. Therefore, it is preferred that the land portion 3b has a larger area than the land portion 3a, such that the land portion 3b be present in the center of the opening 8.

Figure 15A:
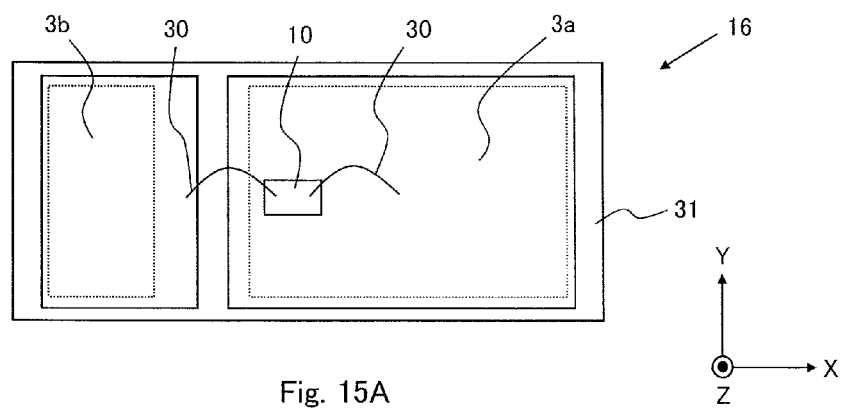
FIGS. 15A, 15B and 15C are a plan view, a cross-sectional view and a bottom view schematically showing a constitutional example of a light-emitting device according to another embodiment, respectively.
Figure 15B:
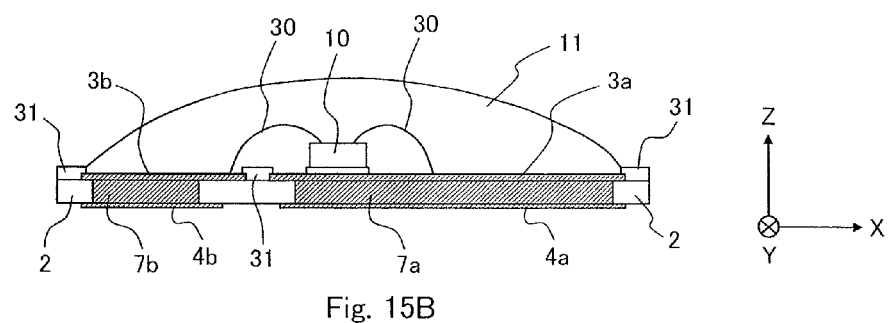
Figure 15C:
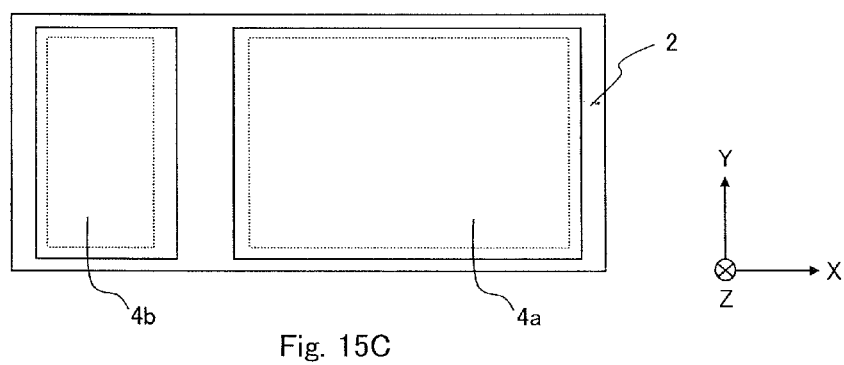

(8) In the above embodiments, the embodiment in which a pair of the land portions 3a and 3b composed of metal film pieces is provided on the top surface of the insulating film 2, the annular liquid-repellent layer 9 having the opening 8 that exposes a circular area containing a central part of the gap is provided in the center on the pair of the land portions 3a and 3b and the gap therebetween, the light-emitting element 10 is mounted in the inside of the opening 8, and the phosphor containing silicon resin 11 that seals the light-emitting element 10 is formed in a dome shape over the opening 8, is described. However, in place of the liquid-repellent layer 9, for example, a white silicon resin 31 is formed around the pair of the land portions 3a and 3b and the gap therebetween, and the phosphor containing silicon resin 11 that seals the light-emitting element 10 may be formed in a dome shape over the region surrounded by the white silicon resin 31 formed around the pair of the land portions 3a and 3b. FIGS. 15A to 15C schematically show a constitutional example of the light-emitting device 16 of this other embodiment. Here, FIGS. 15A and 15C are a plan view viewed from the top surface side and a bottom view viewed from the bottom surface side, and FIG. 15B is a cross-sectional view of the light-emitting device 16 at a cross section perpendicular to the Y direction in which the light-emitting element 10 is cut.

The light-emitting device 16 includes a pair of land portions 3a and 3b composed of metal film pieces on the top surface of an insulating film 2 and includes a pair of external connection terminal portions 4a and 4b composed of metal film pieces on the bottom surface, wherein each of the land portions 3a and 3b adheres to the top surface of the insulating film 2 through an adhesive layer 5, and each of the terminal portions 4a and 4b adheres to the bottom surface of the insulating film 2 through an adhesive layer 6. The land portion 3a and the terminal portion 4a are opposed across the insulating film 2, and electrically connected to each other through a through-conductor 7a that penetrates through the insulating film 2. Similarly, the land portion 3b and the terminal portion 4b are opposed across the insulating film 2, and electrically connected to each other through a through-conductor 7b that penetrates through the insulating film 2. The pair of the land portions 3a and 3b is electrically insulated and separated from each other by a long and narrow gap extending in the Y direction between the land portions. Similarly, the pair of the terminal portions 4a and 4b is also electrically insulated and separated from each other by a long and narrow gap extending in the Y direction between the terminal portions. The white silicon resin 31 is formed in a dam form around the pair of the land portions 3a and 3b and the gap therebetween, for example, by slightly covering the edges of the pair of the land portions 3a and 3b, such that the top surface is slightly higher than the top surface of the pair of the land portions 3a and 3b. In this other embodiment, for example, the land portion 3a has a larger area than the land portion 3b, and the substrate side of a wire-bonding type light-emitting element 10 as same as in the third embodiment is connected to the land portion 3a by die-bonding, then the P electrode (anode) 10a and the N electrode 10b of the light-emitting element 10 are connected to the land portion 3a and the land portion 3b, respectively, using the bonding wire 30. Over the region surrounded by the white silicon resin 31 formed around the pair of the land portions 3a and 3b, a phosphor containing silicon resin 11 sealing the light-emitting element 10 is formed in a dome shape. In this other embodiment, a silver-coated copper foil is used as an example of the metal film piece, and a polyimide film with a film thickness of 0.05 mm is used as an example of the insulating film 2. In addition, as shown in FIG. 15B, the through-conductors 7a and 7b are formed with an area larger than the area of those in the first to third embodiments, as an example. The dashed lines in FIGS. 15A and 15C show the outer circumferences of the through-conductors 7a and 7b.

Furthermore, as another embodiment of this other embodiment, a wire-bonding type light-emitting element 10 may be connected to a pair of land portions 3a and 3b by die-bonding across a white silicon resin 31 in the gap, in the same manner as in the third embodiment. In this case, it is preferred that the areas of the land portions 3a and 3b be equalized in the same manner as in the first to third embodiments. Moreover, as another embodiment of this other embodiment, when a light-emitting element has a structure that the light-emitting element 10 has an N electrode (cathode) 10b in the whole surface of the chip back surface side, a P electrode (anode) 10a is formed on the chip front surface side, and light is emitted from the front surface side, a land portion 3b may have a larger area than the land portion 3a, and the light-emitting element 10 may be electrically and mechanically connected only to the land portion 3b by die bonding, and the P electrode (anode) 10a of the light-emitting element 10 is connected to the land portion 3a through wire bonding. Furthermore, as another embodiment of this other embodiment, when the light-emitting element 10 is a flip chip type light-emitting element, the light-emitting element 10 is flip-chip connected to a pair of land portions 3a and 3b across a white silicon resin 31 in the gap, in the same manner as in the first embodiment. In this case, it is preferred that the areas of the land portions 3a and 3b be equalized in the same manner as in the first to third embodiments.

What is claimed is:

1. A light-emitting device comprising:
   an insulating film,
   at least one pair of land portions comprising metal film pieces formed on a top surface of the insulating film,
   external connection terminal portions comprising metal film pieces formed on a bottom surface of the insulating film, the terminal portions being opposed to the land portions across the insulating film in one-to-one correspondence,
   through-conductors that connect between the land portions and the terminal portions corresponding to each other through the insulating film,
   a light-emitting element that is electrically connected to the pair of the land portions and disposed in a unit section which contains the pair of the land portions, and
   an annular liquid-repellent layer on each pair of the land portions, the annular liquid-repellent layer having an opening in the center, the opening exposing at least part of a gap between the pair of the land portions, wherein the light-emitting element is disposed inside the opening, and
   a phosphor containing resin or transparent resin that seals the light-emitting element is formed in a dome shape in the opening.

2. The light-emitting device according to claim 1, wherein the liquid-repellent layer comprises a liquid-repellent material.

3. The light-emitting device according to claim 1, wherein the liquid-repellent layer contains phosphor.

4. The light-emitting device according to claim 1, wherein the insulating film and the land portions, and the insulating film and the terminal portions, are connected through an adhesive layer, respectively.

5. The light-emitting device according to claim 1, wherein
   a cutting region for singulating the unit section as a minimum unit is provided around the unit section on the insulating film in a lattice pattern,
   a pair of the terminal portions is formed on the bottom surface of the insulating film, per the unit section surrounded by the cutting region, and the metal film pieces are not formed on the top surface and the bottom surface of the insulating film in the cutting region.

6. The light-emitting device according to claim 5, wherein the insulating film is cut along the cutting region, whereby one or a plurality of the unit sections is singulated.

7. The light-emitting device according to claim 1, wherein a reinforcement material is filled in a gap between a pair of the terminal portions corresponding to the pair of the land portions, per the unit section.

8. A method for manufacturing a light-emitting device comprising the steps of:
   forming at least one pair of land portions comprising metal film pieces, on a top surface of an insulating film,
   forming external connection terminal portions comprising metal film pieces, that are opposed to the land portions across the insulating film in one-to-one correspondence, on a bottom surface of the insulating film,
   forming through-conductors that connect between the land portions and the terminal portions corresponding to each other through the insulating film,
   forming an annular liquid-repellent layer on each pair of the land portions, the annular liquid-repellent layer having an opening in the center, the opening exposing at least part of a gap between the pair of the land portions,
   electrically connecting a light-emitting element to the pair of the land portions and disposing the light-emitting element in a unit section which contains the pair of the land portions and a gap therebetween, and
   forming a phosphor containing resin or transparent resin that seals the light-emitting element in a dome shape in the opening, wherein
   the light-emitting element is disposed in the inside of the opening.

9. The method for manufacturing a light-emitting device according to claim 8, wherein the liquid-repellent layer comprises a liquid-repellent material.

10. The method for manufacturing a light-emitting device according to claim 8, wherein the step of forming the phosphor containing resin or transparent resin includes covering the top side of the insulating film with a mask member having an opening per the unit section, the opening exposing at least part of the opening of the liquid-repellent layer, and injecting the phosphor containing resin or transparent resin into the opening of the mask member.

11. The method for manufacturing a light-emitting device according to claim 10, wherein the liquid-repellent layer contains phosphor.

12. The method for manufacturing a light-emitting device according to claim 10, wherein the opening of the mask member is formed such that a top surface of the liquid-repellent layer is not exposed when the liquid-repellent layer is covered with the mask member.

13. The method for manufacturing a light-emitting device according to claim 10, wherein the injection of the phosphor containing resin or transparent resin is carried out by a squeegee printing method or potting method, using the mask member or a mask member provided with a liquid-repellent film on an inner wall of the opening of the mask member.

14. The method for manufacturing a light-emitting device according to claim 8, comprising a step of cutting the insulating film along a cutting region to singulate one or a plurality of the unit sections, the cutting region being provided around the unit section for singulating the unit section as a minimum unit.

15. The method for manufacturing a light-emitting device according to claim 14, wherein the insulating film is cut along the cutting region using a commercially available simple cutting tool such as a box cutter, a roller cutter, or a rotary cutter.

16. A light-emitting device comprising:
   an insulating film,
   at least one pair of land portions comprising metal film pieces formed on a top surface of the insulating film,
   external connection terminal portions comprising metal film pieces formed on a bottom surface of the insulating film, the terminal portions being opposed to the land portions across the insulating film in one-to-one correspondence,
   through-conductors that connect between the land portions and the terminal portions corresponding to each other through the insulating film, and
   a light-emitting element that is electrically connected to the pair of the land portions and disposed in a unit section which contains the pair of the land portions,
   a white silicon resin formed around the pair of the land portions and in the gap therebetween, and
   a phosphor containing resin or transparent resin that seals the light-emitting element formed in a dome shape over the region surrounded by the white silicon resin formed around the pair of the land portions.

17. The light-emitting device according to claim 16, wherein the insulating film and the land portions, and the insulating film and the terminal portions, are connected through an adhesive layer, respectively.

18. The light-emitting device according to claim 16, wherein
   a cutting region for singulating the unit section as a minimum unit is provided around the unit section on the insulating film in a lattice pattern,
   a pair of the terminal portions is formed on the bottom surface of the insulating film, per the unit section surrounded by the cutting region, and
   the metal film pieces are not formed on the top surface and the bottom surface of the insulating film in the cutting region.

19. The light-emitting device according to claim 18, wherein the insulating film is cut along the cutting region, whereby one or a plurality of the unit sections is singulated.

20. The light-emitting device according to claim 16, wherein a reinforcement material is filled in a gap between a pair of the terminal portions corresponding to the pair of the land portions, per the unit section.

* * * * *